United States Patent [19]

Kanazawa et al.

[11] 4,161,022

[45] Jul. 10, 1979

[54] CONTROLLABLE RECTIFIER CIRCUIT FOR A POWER SUPPLY

[75] Inventors: Kenichi Kanazawa, Atsugi; Nobuyuki Takahashi, Tokyo, both of Japan

[73] Assignee: Sony Corporation, Tokyo, Japan

[21] Appl. No.: 931,765

[22] Filed: Aug. 7, 1978

[30] Foreign Application Priority Data

Aug. 9, 1977 [JP] Japan .................................. 52-95231

[51] Int. Cl.² ........................................... H02M 7/155
[52] U.S. Cl. ................................... 363/88; 219/10.75; 363/128
[58] Field of Search ....................... 219/10.75, 130, 51; 363/85, 88, 125, 126, 128

[56] References Cited

U.S. PATENT DOCUMENTS 3,670,226   6/1972   Mazza ................................ 363/88 X

FOREIGN PATENT DOCUMENTS 708281   4/1965   Canada ..................................... 363/128

*Primary Examiner*—William M. Shoop
*Attorney, Agent, or Firm*—Lewis H. Eslinger; Alvin Sinderbrand

[57] ABSTRACT

A controllable rectifier circuit which may be used in a power supply selectively produces a half-wave or a full-wave rectified signal. The rectifier circuit includes a pair of input terminals for receiving an AC signal and a bridge rectifier coupled to the input terminals and including a pair of output terminals across which a rectified AC signal is produced. The bridge rectifier comprises a first current path including a switchable rectifier for conducting positive half cycles of the AC signal and a second current path including a switchable rectifier for conducting negative half cycles of the AC signal. A pulse generator is supplied with reduced amplitude versions of the positive and negative half cycles of the AC signal, in sequence, to produce an output pulse when the reduced amplitude of the half cycle supplied thereto is less than a predetermined level. A non-reduced half cycle of the AC signal is selectively supplied to the pulse generator to prevent the pulse generator from generating an output pulse during that half cycle so that an output pulse is generated only during the beginning and ending portions of the other half cycle. The generated output pulses are supplied to each of the switchable rectifiers, whereby the bridge rectifier rectifies both half cycles of the AC signal when the non-reduced half cycle is not supplied to the pulse generator, and the bridge rectifier rectifies only the other half cycle of the AC signal when the non-reduced half cycle is supplied to the pulse generator.

10 Claims, 18 Drawing Figures

FIG. 4A
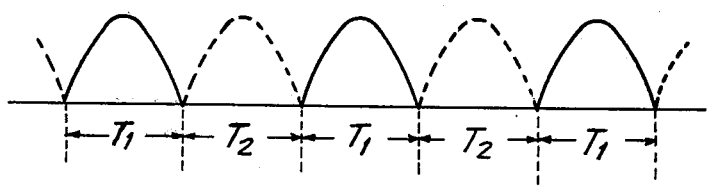
FIG. 4B
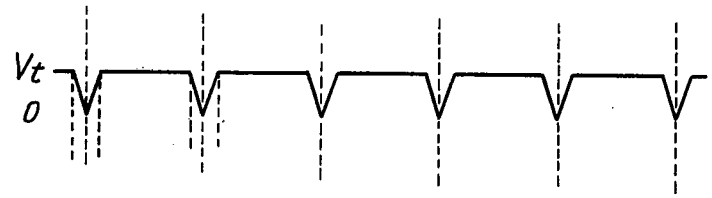
FIG. 4C
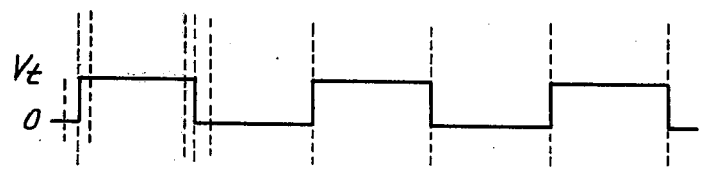
FIG. 4D
FIG. 4E
FIG. 4F
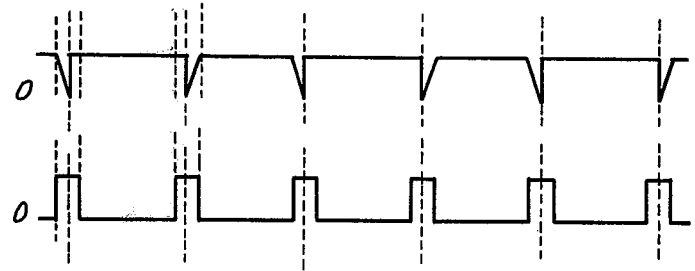
FIG. 4G
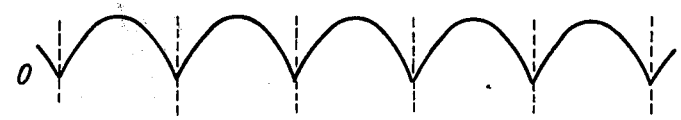
FIG. 4H
FIG. 4I

CONTROLLABLE RECTIFIER CIRCUIT FOR A POWER SUPPLY

BACKGROUND OF THE INVENTION

This invention relates to a controllable rectifier circuit and, more particularly, to such a controllable rectifier circuit which can be used in a power supply and which is capable of producing either a half-wave or a full-wave rectified signal as a function of a control signal supplied to the circuit.

In a typical power supply, for example, a supply for producing DC power from AC power, a rectifier is used to convert an input AC signal to a DC signal. Generally, such a rectifier is a full wave rectifier formed of, for example, a bridge rectifier circuit. As is known, the bridge rectifier rectifies both the positive and negative half cycles of the AC signal so as to produce successive, rectified half cycles. Of course, the DC power which is derived from the full wave rectifier is greater than that which would be derived if the rectifier was a half wave rectifier whereby only alternate half cycles of the AC signal would be rectified and supplied to a load. There are many applications wherein a particular rectifier, such as a bridge rectifier, should be controlled to vary the amount of power which is supplied thereby. Thus, if it is desired to utilize the rectifier to produce a lower power level, it is convenient to operate that rectifier as a half wave rectifier. When that same rectifier is to supply a higher power level, then it should be operated as a full wave rectifier.

One application of such a controllable rectifier circuit that is convertible from half wave rectification to full wave rectification is in supplying power to an induction heating device. In such a device, an induction element, typically a coil, is supplied with relatively high frequencies to generate an alternating flux. If a conducting material is placed in this flux, eddy currents are induced therein, and these induced eddy currents produce heat. The amount of heat is a function of the frequency of the flux as well as the magnitude thereof. The magnitude of the flux is a function of the power supplied to the induction element, and the frequency at which the flux changes is determined by opening and closing a switching device which is connected in series with the element. Thus, the amount of heat which is produced by the induction heating device easily can be controlled by controlling the frequency at which the switching device operates and by controlling the amount of power which is supplied to the induction heating device.

In one type of control circuit for an induction heating device, a controllable oscillator is provided to drive the switching device, the frequency of this oscillator being controlled continuously by an adjustable element, such as a potentiometer. Thus, when the amount of heat is to be increased, the setting of the potentiometer is changed so as to provide a continuous, gradual change in the oscillator frequency, thus changing the switching frequency of the switching device and the rate of change of the flux which is generated by the induction element. For lower heating levels, the current which is supplied to the induction heating element is a half wave rectified AC current. Thus, the magnitude of the flux which is generated by the induction element is relatively low. When the heating level is to be increased to a higher range, the power supply is operated as a full wave rectifier to supply full wave rectified current to the induction element. This, of course, increases the magnitude of the flux generated thereby. In order to provide a continuous increase in the heating levels over the lower and higher ranges, it is usual to return the frequency of the controllable oscillator to its initial frequency at the time that the conversion is made from half wave rectification to full wave rectification, and then to gradually change the frequency of the oscillator once again.

One advantage in changing both the frequency and magnitude of the generated flux rather than just the frequency thereof is that a relatively large heat controlling range can be obtained while using only a relatively narrow frequency range. Since a smaller frequency range is needed, the noise frequencies which are radiated from the induction heating device also are limited to a smaller range. Furthermore, since the controllable oscillator need be varied over only a relatively narrow frequency range, it can be of simpler construction and, therefore, of lower cost. Also, the switching device which is used to interrupt the rectified current flowing the induction element is not very expensive.

One technique in operating a bridge rectifier either as a half wave rectifier or as a full wave rectifier is to provide two of the arms of the rectifier, and thus both of the current paths therein, with switchable rectifiers, such as thyristors. If only one of the thyristors is rendered conductive, then only one of the half cycles of the input AC signal will be rectified, thus resulting in half wave rectification thereof. On the other hand, if both thyristors are rendered conductive, then first one current path will conduct one half cycle and then the other current path will conduct the other half cycle of the AC signal, thus resulting in full wave rectification. It is important to trigger the thyristors into conduction at the beginning of the respective half cycle which is conducted thereby. If trigger pulses are generated at the beginning of each half cycle, such trigger pulses may overlap the ending portion of the previous half cycle and the beginning portion of the next half cycle. For full wave rectification, this presents no problem because both half cycles are conducted, in sequence, by the respective thyristors. However, this overlap in the trigger pulses is not desired when half wave rectification is obtained. For example, let it be assumed that only the positive half cycles are to be conducted. This means that the thyristor which is included in the positive current path will be triggered into conduction only at the beginning of the positive half cycle, even if the trigger pulse applied thereto overlaps with the ending portion of the negative half cycle. However, if this same trigger pulse is supplied to the thyristor which is included in the negative current path, then this thyristor will be conductive during the ending portion of the negative half cycle because of such a trigger pulse. Consequently, the half wave rectified current which is produced appears as alternate positive half cycles with a noise pulse superimposed onto the beginning of each positive half cycle. Such noise pulses may result in the generation of undesired, radiated noise and, moreover, may damage the elements which constitute the induction heating device.

OBJECTS OF THE INVENTION

Therefore, it is an object of the present invention to provide an improved controllable rectifier circuit which can selectively produce either half-wave or full-wave rectified signals.

Another object of this invention is to provide a convertible half/full wave rectifier for use in a power supply to supply a controllable amount of power to a load.

A further object of this invention is to provide a controllable rectifier circuit which avoids the problems noted hereinabove.

An additional object of this invention is to provide a controllable rectifier circuit which can generate either full wave rectified signals or half wave rectified signals, and wherein spurious noise pulses are not generated when operated as a half wave rectifier.

Various other objects, advantages and features of the present invention will become readily apparent from the ensuing detailed description, and the novel features will be particularly pointed out in the appended claims.

SUMMARY OF THE INVENTION

In accordance with this invention, a controllable rectifier circuit is provided for selectively producing a half-wave or a full-wave rectified signal. The controllable rectifier circuit includes a pair of input terminals for receiving an AC signal and a bridge rectifier coupled to the input terminals and having a pair of output terminals across which a rectified AC signal is produced. The bridge rectifier includes a first current path including a switchable rectifier, such as a thyristor, for conducting positive half cycles of the AC signal and a second current path including a switchable rectifier for conducting negative half cycles of the AC signal. A pulse generator is coupled to the input terminals for receiving, in sequence, reduced amplitude versions of the positive and negative half cycles of the AC signal to produce an output pulse when the reduced amplitude of a respective one of the half cycles is less than a predetermined level. An inhibit circuit is selectively operable to supply one of the half cycles of the AC signal, in non-reduced form, to the pulse generator so as to prevent the pulse generator from producing an output pulse during that half cycle, whereby output pulses are produced only during the beginning and ending portions of each of the other cycle. These output pulses are supplied to the switchable rectifiers to trigger those rectifiers into conduction when a respective half cycle is supplied thereto. Consequently, the bridge rectifier rectifies both half cycles of the AC signal when the inhibit circuit does not supply a non-reduced half cycle to the pulse generator, and the bridge rectifier rectifies only alternate half cycles of the AC signal when the inhibit signal operates to supply the non-reduced half cycle to the pulse generator.

BRIEF DESCRIPTION OF THE DRAWINGS

The following detailed description, given by way of example, will best be understood in conjunction with the accompanying drawings in which:

FIGS. 4A–4I are waveform diagrams which are useful in understanding the operation of the circuit shown in FIG. 3.

DETAILED DESCRIPTION OF A PREFERRED EMBODIMENT

Figure 1:
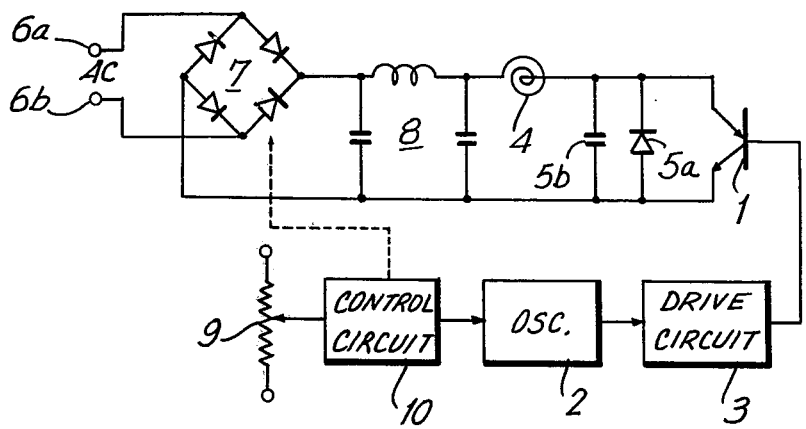
FIG. 1 is a partial block, partial schematic diagram of a controllable power supply which finds ready application with an induction heating device.

As will be appreciated, the present invention advantageously can be utilized in accordance with various divers applications. One such application will be described wherein this invention is employed to control the amount of power which is supplied to an induction heating device. This application is shown in the partial block, partial schematic diagram illustrated in FIG. 1. In this diagram, an induction element 4, such as an induction coil, is adapted to be supplied with a DC current, and a switching device 1, such as a gate controlled switch (GCS) is connected in series with induction element 4 so as to periodically interrupt the DC current, whereby the induction element generates an alternating flux. As is known, if a conducting material is placed in this alternating flux, eddy currents are induced in the conducting material, which eddy currents generate heat. Thus, that which is supported on or contained in a vessel formed of the conducting material is heated or cooked.

More particularly, an oscillating signal is generated by a controllable oscillator 2 and is supplied to a drive circuit 3 which, in turn, drives the control input of GCS 1 with a relatively high frequency drive signal. The output electrodes of GCS 1 are connected in series with induction element 4. In addition, a rectifier 7, such as a bridge rectifier, is coupled to a pair of input terminals 6a and 6b to receive an AC signal, such as may be supplied thereto from AC mains, and the bridge rectifier additionally includes a pair of output terminals which are connected in series with induction element 4 and GCS 1. Thus, rectifier 7 supplies rectified AC signals to the induction element. In addition, a filter circuit 8 is interposed between rectifier 7 and induction element 4 for the purpose of filtering or smoothing the rectified signal produced by rectifier 7. In this manner, the combination of rectifier 7 and filter 8 supply induction element 4 with DC power. The operation of GCS 1 functions to periodically interrupt the direct current which is supplied to the induction element.

The amount of heat generated by induction element 4 is selected in accordance with a manual adjustment of a controlling element, such as a settable potentiometer 9. That is, depending upon the setting of the potentiometer, a corresponding amount of heat is generated by the induction element. An adjustment to potentiometer 9 results in a corresponding adjustment in the amount of generated heat. To this effect, a control circuit 10 is coupled to the wiper, or equivalent, of potentiometer 9, and is adapted to produce control signals as a function of the setting of the potentiometer. As illustrated in FIG. 1, control circuit 10 is coupled to oscillator 2 so as to supply a frequency-determining signal, such as a frequency-determining voltage, to the oscillator. As represented by the broken line, control circuit 10 also is adapted to vary, or control, the operation of rectifier 7. The combined result of controlling oscillator 2 and controlling the operation of rectifier 7 achieves a corresponding control over the heat generated by induction element 4.

A diode 5a and a capacitor 5b are connected in parallel across the output terminals of GCS 1. Capacitor 5b combines with the inductance of inductance element 4 to form a resonant circuit. Diode 5a functions as a damper diode. When GCS 1 is turned ON by the high frequency drive signals supplied thereto, current flows from rectifier 7, through filter 8, to inductance element 4 and through GCS 1 back to rectifier 7. When the GCS is turned OFF in response to the high frequency drive signals supplied thereto, a half cycle of a resonant current flows through inductance element 4 and capacitor 5 5b. Damper diode 5a damps this resonant current after the first half cycle. Thus, it may be appreciated that the inductance element, GCS, capacitor and diode operate in a manner analogous to the operation of a conventional horizontal deflection circuit in a cathode ray tube.

Figure 2A:
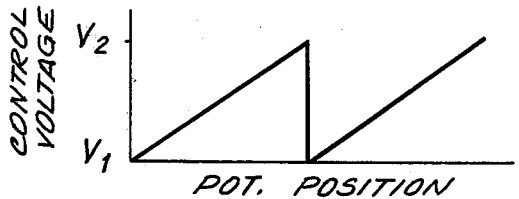
FIGS. 2A–2D are waveform diagrams which are helpful in understanding the operation of the apparatus shown in FIG. 1.
Figure 2B:
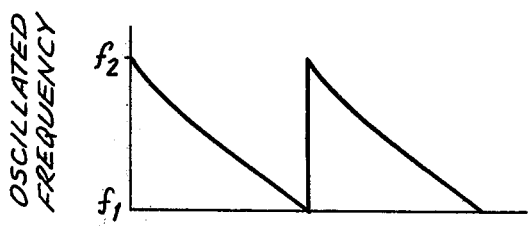

The manner in which the heat which is generated by inductance element 4 is controlled now will be described with reference to the waveforms shown in FIGS. 2A–2D. Let it be assumed that the wiper of potentiometer 9 is adjusted from a setting corresponding to a low heat level to a setting corresponding to a high heat level. As this setting changes, it is assumed that the output voltage produced at the wiper of the potentiometer increases in a linear manner. Thus, the voltage supplied to control circuit 10 likewise increases. As a result of this change in the position of the wiper of potentiometer 9, the control voltage supplied to oscillator 2 by control circuit 10 increases from an initial value $V_1$ towards a higher value $V_2$, as shown in FIG. 2A. Controllable oscillator 2 is of the type wherein the frequency of the oscillating signal produced thereby varies inversely with the control voltage supplied thereto. Consequently, the frequency of the oscillating signal, and thus the frequency of the drive signal supplied to GCS 1, decreases from a higher frequency $f_2$ toward a lower frequency $f_1$ as shown in FIG. 2B, as the position of the wiper of the potentiometer changes. As the frequency of the drive signals decreases, the frequency of the flux generated by induction element 4 likewise decreases so as to increase the amount of heat induced thereby.

Figure 2C:
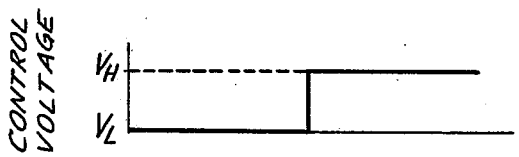

Control circuit 10 is of the type wherein, when the wiper of potentiometer 9 reaches a predetermined position, the control voltage produced by the control circuit abruptly returns to its initial level $V_1$ and then gradually increases to the level $V_2$, as shown in FIG. 2A. For example, a sensor may be provided to detect when the wiper of the potentiometer reaches this predetermined position so as to connect a voltage divider in circuit, whereby the higher voltage level $V_2$ which then is produced is divided down to the level $V_1$. As may be appreciated, other arrangements can be used to return the control voltage to its lower level $V_1$ when the wiper of the potentiometer reaches the predetermined position. At the same time that the control voltage abruptly changes from the level $V_2$ to the level $V_1$, control circuit 10 also produces another control voltage having a step function therein, as shown in FIG. 2C. Thus, when potentiometer 9 is adjusted to the predetermined setting, this other control voltage level increases from a lower level $V_L$ to a higher level $V_H$. This other control voltage is used to change over the operation of rectifier 7 from half wave rectification to full wave rectification. Consequently, the current supplied to induction element 4 by rectifier 7 increases when the rectifier is changed over from a half wave rectifier to a full wave rectifier. Thus, because of this increase in current, the flux generated by the induction element also increases so as to increase the amount of heat generated thereby.

Figure 2D:
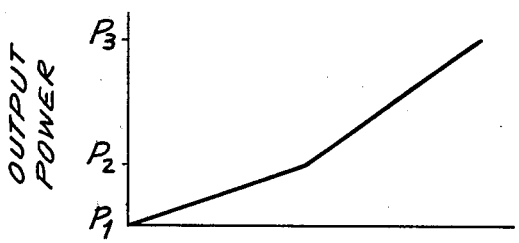

A graphical representation of the amount of heat generated by induction element 4, that is, the amount of power derived from the induction element, is illustrated in FIG. 2D. It is seen that, when rectifier 7 functions as a half wave rectifier, the decrease in frequency from $f_2$ to $f_1$ of the drive signals supplied to GCS 1 results in a power increase from level $P_1$ to level $P_2$. At the time that the power level $P_2$ is reached, the wiper of potentiometer 9 is positioned to effect the predetermined potentiometer setting. Consequently, the frequency of the drive signal supplied to GCS 1 returns to $f_2$, but rectifier 7 now operates as a full wave rectifier. Therefore, although the frequency of the flux now is increased, which would tend to decrease the power, the current supplied to induction element 4, and thus the magnitude of this flux is increased so as to counteract such a decrease in power. Now, as the setting of the potentiometer is further adjusted, the control voltage again increases from level $V_1$ to level $V_2$, thus decreasing the frequency of the drive signal supplied to GCS 1. Consequently, the power derived from induction element 4 now increases from level $P_2$ toward level $P_3$. However, the decrease in frequency of the drive signal supplied to the GCS now occurs in combination with an increase in the current supplied to the induction element. This means that a larger increase in power is obtained with each change in the setting of the potentiometer. Thus, the slope of the power characteristic from $P_2$ to $P_3$, as shown in FIG. 2D, is greater than the slope of the power characteristic from $P_1$ to $P_2$.

As mentioned above, it is advantageous to control the power derived from induction element 4 by a combination of current control and frequency control, rather than merely frequency control. It may be appreciated that, in order to vary the power output from level $P_1$ to level $P_3$, it would be necessary to provide a much greater frequency range over which the frequency of the drive signal supplied to GCS 1 changes. This means that oscillator 2 and drive circuit 3 would be of far more complicated, and expensive, construction. Also, GCS 1 would be relatively expensive. Furthermore, the noise frequencies as radiated from induction element 4 would extend over this relatively large range. Now, by controlling the power output from the induction element as a function of the direct current supplied by rectifier 7, the frequency range over which the drive signal must vary can be confined to a much smaller range. This avoids the aforenoted problems. Of course, if the power output from induction element 4 is controlled only as a function of current, the problems attending the use of higher frequency drive signals may be avoided. However, power control is not as accurate if only the supply current is regulated. That is, by regulating the switching frequency of GCS 1, a more precise control over the heat derived from induction element 4 is attained.

Figure 3:
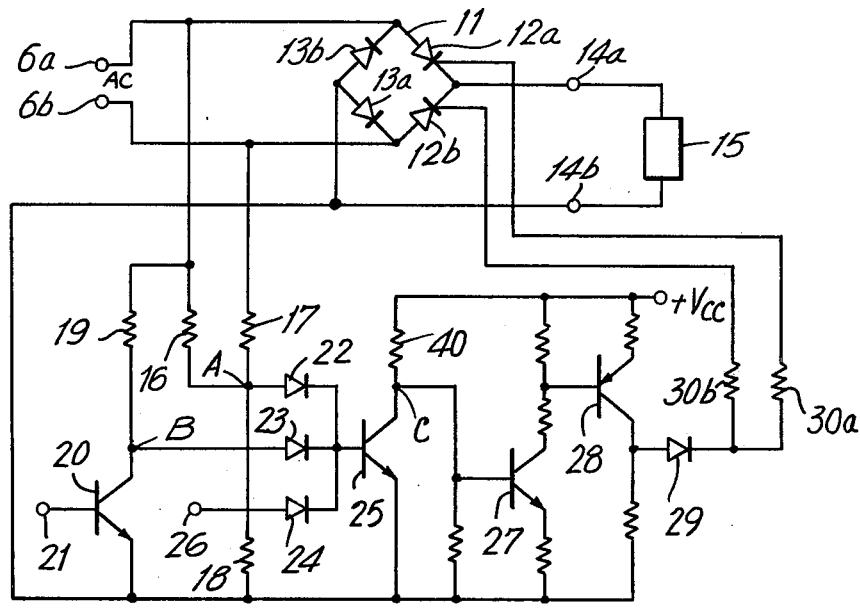
FIG. 3 is a schematic diagram of a preferred embodiment of the controllable rectifier circuit in accordance with the present invention.

The present invention is directed to control circuit 10 and the manner in which this control circuit is used in conjunction with rectifier 7 so as to change over the operation of the rectifier from half wave to full wave rectification. A schematic diagram of the rectifier control circuit in accordance with the present invention is illustrated in FIG. 3. As shown, the rectifier circuit is a bridge rectifier 11 coupled to input terminals 6a and 6b to receive the AC power supply signal which may be supplied by, for example, AC mains. Rectifier 11 includes a pair of output terminals 14a and 14b across which a load 15 is connected. A first current path in rectifier 11 includes a switchable rectifier 12a, which may be a thyristor, such as an SCR, and this first current path extends from input terminal 6a, through thyristor 12a, to output terminal 14a, through load 15, to output terminal 14b and then back to input terminal 6b via a diode 13a. Rectifier 11 includes a second current path which contains a second switchable rectifier 12b, which may be a thyristor, such as an SCR. This second current path extends from input terminal 6b, through thyristor 12b, to output terminal 14a, through load 15, to output terminal 14b and then back to input terminal 6a through a diode 13b. Thus, the positive half cycle of the input AC signal is supplied from input terminal 6a through the first current path to input terminal 6b. The immediately following negative half cycle of the input AC signal is conducted from input terminal 6b over the second current path and then back to input terminal 6a. Hence, it is seen that, as is conventional, full wave rectifier 11 supplies successive half cycles of current through load 15 in a single direction. Of course, the operation of bridge rectifier 11 is dependent upon the conduction of thyristors 12a and/or 12b. That is, if thyristor 12a is conductive during the positive half cycles and if thyristor 12b is conductive during the negative half cycles, then bridge 11 functions as a full wave rectifier. However, if only one or the other of the thyristors is conductive during its respective half cycle, then rectifier 11 functions as a half wave rectifier.

The control circuit which is used to supply trigger pulses to thyristors 12a and 12b so as to determine whether rectifier 11 functions as a half wave or full wave rectifier now will be described. This control circuit includes an attenuating circuit, a pulse generator and an inhibit circuit. The attenuating circuit is comprised of a first attenuator shown as a voltage divider comprised of resistors 16 and 18 connected to input terminal 6a, and a second attenuator shown as a voltage divider comprised of resistors 17 and 18 connected to input terminal 6b. The junction defined by resistors 16 and 18 is adapted to provide an attenuated, or reduced amplitude version of the positive half cycle of the AC signal which is applied across input terminals 6a and 6b. Similarly, the junction defined by resistors 17 and 18 is adapted to provide an attenuated, or reduced amplitude version of the negative half cycles of the AC signal which is supplied across the input terminals. These outputs of the respective attenuators, or voltage dividers, are connected to a point A so as to produce cyclical, reduced amplitude versions of the positive and negative half cycles, in sequence. It may be appreciated that output terminal 14b of rectifier 11 functions as the reference output terminal to which these attenuators are connected.

The pulse generator is comprised of a transistor 25 and a trigger circuit which is connected to the collector electrode of this transistor. Point A is connected to the base electrode of transistor 25 by a diode 22. This transistor is an inverting transistor whose emitter electrode is connected to reference terminal 14b and whose collector electrode is connected through a load resistor 40 to a source of operating potential $+V_{cc}$. The trigger circuit which is connected to the collector electrode of transistor 25 is comprised of a transistor 27, adapted to function as a polarity inverter, and a transistor 28 which is adapted to function as a current converter. Transistor 27 is shown as an NPN transistor having series-connected resistors included in its collector circuit, and transistor 28 is shown as a PNP transistor whose base electrode is connected to the junction defined by these series resistors. The emitter electrode of transistor 28 is coupled through an emitter resistor to the source of operating potential $+V_{cc}$, and the collector electrode of this transistor is connected through a diode 29 to the gate terminal of thyristor 12a by a resistor 30a, and to the gate terminal of thyristor 12b by a resistor 30b.

The inhibit circuit included in the rectifier control circuit shown in FIG. 3 is comprised of a resistor 19 and a transistor 20. Resistor 19 is connected to input terminal 6a and is adapted to supply an unattenuated, or non-reduced, version of the positive half cycle of the AC signal to the base electrode of transistor 25. For this purpose, resistor 19 is connected in series with a diode 23, this series circuit being coupled to the base electrode of transistor 25. The junction defined by resistor 19 and diode 23, designated as point B, is selectively shunted to the reference output terminal 14b by the collector-emitter circuit of transistor 20. To this effect, an input 21 is connected to the base electrode of this transistor, this input being selectively supplied with a control voltage of the type shown in FIG. 2C for selectively rendering transistor 20 conductive.

Transistor 25 is further controlled by an ON/OFF signal which is selectively supplied to an input 26 and coupled to the base electrode of transistor 25 by a diode 24.

The manner in which the illustrated rectifier control circuit operates now will be described in conjunction with the waveform diagrams shown in FIGS. 4A–4I. Since the input voltage applied across input terminals 6a and 6b is an AC voltage, the positive half cycle of this voltage appears during alternate half cycles at input terminal 6a for durations $T_1$, as shown by the solid curves in FIG. 4A. The negative half cycles of the AC voltage appear at input terminal 6b during intermediate time intervals $T_2$, as shown by the broken curves in FIG. 4A. The attenuator formed of resistors 16 and 18 supplies an attenuated version of the positive half cycles to the base electrode of transistor 25. It may be appreciated that diode 22 and the base-emitter circuit of transistor 25 having a limiting effect on this attenuated version of the positive half cycle. That is, if the sum of the forward diode voltage and the base-emitter voltage is represented as a threshold voltage $V_t$, transistor 25 is rendered conductive when the attenuated version of the positive half cycle of the AC voltage exceeds this threshold level $V_t$. Furthermore, the voltage appearing at point A is limited such that it will not exceed the threshold $V_t$ even as the positive half cycle of the AC voltage is further increased. However, transistor 25 remains non-conductive whenever the voltage appearing at point A is below the threshold level $V_t$.

A similar operation obtains with respect to the negative half cycles of the AC voltage. Thus, when the attenuated version of the negative half cycle, which attenuated version is provided at point A, is less than the threshold level $V_t$, transistor 25 remains non-conductive. When the amplitude of the negative half cycle increases sufficiently such that the voltage at point A is equal to the threshold level $V_t$, then transistor 25 is turned ON. The forward diode voltage across diode 22 and the base-emitter voltage of transistor 25 limits the maximum amplitude of the attenuated version of the negative half cycle at point A to the threshold level $V_t$. Accordingly, the voltage at point A in response to the positive and negative half cycles which alternately are supplied to input terminals 6a and 6b appear as shown in FIG. 4B. Hence, it is seen that this voltage increases from a zero level to a limited level corresponding to the threshold level $V_t$.

From FIG. 4B, it is recognized that transistor 25 essentially is not conducting when the attenuated versions of the positive and negative half cycles of the AC voltage are less than threshold level $V_t$. Thus, when the transistor is in its non-conductive condition, its collector voltage, that is, the voltage appearing at point C, is at a relatively high level. Conversely, when transistor 25 is in its conductive condition, its collector voltage is at a relatively low level. This voltage is represented by the pulse waveform shown in FIG. 4E. Hence, a pulse is produced commencing at the ending portion of one half cycle, and this pulse terminates at the beginning portion of the next half cycle. These pulses appearing at point C, and shown in FIG. 4E, are applied to the trigger circuit formed of transistors 27 and 28. Consequently, trigger pulses are supplied from this trigger circuit through diode 29 and resistors 30a and 30b to the control terminals, or gate inputs, of thyristors 12a and 12b. With respect to thyristor 12a, the trigger pulse supplied to its gate terminal conditions this thyristor to its conducting state so as to conduct the positive half cycle of the input AC signal. Thus, at the start of the positive half cycle, the trigger pulse supplied to this thyristor renders it conductive so that the positive half cycle is supplied to load 15. At the ending portion of this positive half cycle, the next trigger pulse triggers thyristor 12b to its conducting condition. However, since a negative half cycle does not appear at input terminal 6b at this time, current does not yet flow through this thyristor. But, at the completion of the positive half cycle and at the beginning portion of the next following negative half cycle, current ceases to flow through thyristor 12a, and the negative half cycle current now flows through thyristor 12b to load 15. Thus, the pulses shown in FIG. 4E which are provided at point C in the embodiment of FIG. 3 control rectifier 11 to function as a full wave rectifier, whereby rectified current is supplied to load 15 as shown in FIG. 4G.

The foregoing discussion has not taken into account the operation of transistor 20. As will become apparent, in order to achieve a full wave rectification of the input AC signal, transistor 20 must be ON. That is, this transistor shunts the unattenuated version of the positive half cycle of the input AC signal to the reference output terminal 14b so that this unattenuated positive half cycle is not supplied to the base electrode of transistor 25. Let it now be assumed that transistor 20 is turned OFF. This is achieved by supplying a relatively low base voltage to this transistor. As a consequence thereof, the unattenuated version of the positive half cycle which is provided at input terminal 6a is supplied through resistor 19 and diode 23 as a relatively large magnitude positive pulse to the base electrode of transistor 25. In fact, when compared to the attenuated versions of the positive and negative half cycles which appear at point A, this unattenuated version has positive and negative flanks, or increasing and decreasing portions, of much greater slope. Accordingly, since the forward voltage of diode 23 together with the base-emitter voltage of transistor 25 serve to limit the maximum amplitude of the unattenuated positive half cycle which appears at point B to the threshold level $V_t$, this voltage effectively appears as a rectangular waveform as shown in FIG. 4C. Transistor 25 is rendered conductive when the voltage at point B, which is applied to its base electrode, is at the threshold level $V_t$, and this transistor is rendered non-conductive when the voltage at point B returns to a zero level. Thus, since the unattenuated positive half cycle of the input AC signal has much steeper positive-going and negative-going flanks than the attenuated version thereof, it is appreciated that transistor 25 is rendered conductive throughout substantially the entire positive half cycle of the input AC signal, regardless of the level of the attenuated positive half cycle which appears at point A.

FIG. 4D represents a waveform of the voltage which is applied to transistor 25 when transistor 20 is turned OFF. It is seen that this waveform is a composite voltage formed of the combination of the rectangular waveform shown in FIG. 4C and the waveform shown in FIG. 4B. Thus, at the beginning portion of the positive half cycle of the input AC signal, the base voltage of this transistor abruptly rises to a limited level. Then, at the completion of the positive half cycle, this base voltage abruptly falls to a zero level. During the beginning portion of the immediately following negative half cycle, the base voltage applied to transistor 25 is seen to increase gradually. This is because the base voltage is derived from the attenuated amplitude of the negative half cycle. Of course, this gradual increase in the base voltage of transistor 25 during the negative half cycle is limited by the limiting action of diode 22 and the base-emitter circuit of the transistor. At the ending portion of the negative half cycle the base voltage gradually decreases from its limited level to the zero level. At the next positive half cycle, the foregoing operation is repeated.

Accordingly, in view of the base voltage applied to transistor 25, as shown in FIG. 4D, it is seen that, since transistor 25 is conductive throughout substantially the entire positive half cycle, the voltage appearing at its collector electrode, that is, at point C, increases to a relatively higher level only during the periods of non-conduction. That is, and as shown in FIG. 4F, the voltage at point C appears as a series of pulses during the beginning and ending portions only of each negative half cycle. No pulses are produced during the beginning and ending portions of each positive half cycle. These pulses (FIG. 4F) are supplied to the gate electrodes of thyristors 12a and 12b by diode 29 and resistors 30a and 30b, respectively.

Since a trigger pulse is supplied to the gate electrode of thyristor 12b at the beginning portion of the negative half cycle, this thyristor is rendered conductive so as to conduct this negative half cycle to load 15. During the ending portion of this negative half cycle, a trigger pulse once again is supplied to thyristor 12b. However, since this thyristor already is conducting, the trigger pulse has no effect thereon. Although the trigger pulses which are supplied to the gate electrode of thyristor 12b also are supplied to the gate electrode of thyristor 12a, they have no effect on the conducting state of this latter thyristor. This is because these trigger pulses are supplied only during the beginning and ending portions of the negative half cycle. At those times, since a positive half cycle is not supplied to thyristor 12a from input terminal 6a, the thyristor cannot conduct. Accordingly, the rectified current which is supplied to load 15 from rectifier 11 is as shown in FIG. 4H. Thus, when transistor 20 is turned OFF, rectifier 11 operates as a half wave rectifier.

In view of the foregoing, it is seen that transistor 25, taken in conjunction with the trigger circuit formed of transistors 27 and 28, and as controlled by the attenuators connected to input terminals 6a and 6b and the selective inhibit circuit formed of transistor 20, functions to control the operation of rectifier 11 either as a full wave rectifier or as a half wave rectifier. When transistor 20 is turned ON, transistor 25 generates pulses which overlap the adjacent ending and beginning portions of the positive and negative half cycles, as shown in FIG. 4E. Consequently, thyristors 12a and 12b are triggered so that the rectifier supplies a full wave rectified current to the load. However, when transistor 20 is turned OFF, transistor 25 is rendered conductive throughout substantially the entire positive half cycle of the input AC signal in response to the unattenuated positive half cycle which is supplied thereto. Therefore, transistor 25 generates pulses only during the beginning and ending portions of each negative half cycle. No pulses are generated thereby during any portion of the positive half cycles. These pulses, shown in FIG. 4F, are used to trigger thyristor 12b during each negative half cycle, but thyristor 12a is not triggered. Hence, when transistor 20 is turned OFF, rectifier 11 is controlled to supply half wave rectified current to load 15, as shown in FIG. 4H.

In the trigger circuit shown in FIG. 3, diode 29 is provided as a protection device for transistor 28. More particularly, this diode prevents high currents from being supplied to transistor 28, and thus possibly damaging this transistor, when thyristors 12a and 12b are conductive. Thus, high input voltages which are supplied across input terminals 6a and 6b, and which may appear at the gate electrodes of thyristors 12a and 12b are prevented by diode 29 from being applied to transistor 28. Furthermore, resistors 30a and 30b are selected to compensate for any differences in the turn-on characteristics of thyristors 12a and 12b. Still further, it is preferred to attenuate the positive and negative half cycles derived from input terminals 6a and 6b to equal levels. Since resistor 18 is a common resistor in both attenuating circuits, it is preferred that resistors 16 and 17 are of equal resistance so that the respective voltage dividers have equal voltage divider ratios. In this manner, the attenuated amplitudes of the positive and negative half cycles which are supplied to transistor 25 are equal to each other.

The conductivity of transistor 20 is determined by the control signal supplied thereto from control input terminal 21. As may be appreciated, this control signal is of the type shown in FIG. 2C wherein it assumes a relatively low level until a predetermined condition is attained, and then is switched to a relatively high level. When the embodiment shown in FIG. 3 is incorporated into control circuit 10 of FIG. 1, the transition in the control signal supplied to control input terminal 21 is determined by the particular setting of potentiometer 9. Thus, when transistor 20 is turned OFF in response to the low level of the control signal shown in FIG. 2C, rectifier 11 functions as a half wave rectifier. When the setting of potentiometer 9 reaches the predetermined level whereby the control signal undergoes a positive transition, transistor 20 is turned ON and rectifier 11 functions as a full wave rectifier, thereby increasing the current level supplied to load 15.

The conductivity of transistor 25 is further controlled by another control signal supplied to the base electrode of this transistor by a diode 24 from another control input terminal 26. In particular, if a voltage of a relatively high level is supplied to control input terminal 26, transistor 25 is rendered conductive so as to inhibit any pulses from being generated at point C, and thus inhibiting any trigger pulses from being supplied to thyristors 12a and 12b. In the absence of trigger pulses, these thyristors do not conduct and, therefore, no current is supplied from rectifier 11 to load 15. Control input terminal 26 thus may be adapted to receive an override voltage to prevent rectifier 11 from operating, and thereby prevent current from being supplied undesirably to the load. As an example, if the rectifier control circuit shown in FIG. 3 is incorporated into control circuit 10 of FIG. 1 for the purpose of controlling the amount of heat generated by the induction heating device, then the control voltage which is applied to control input terminal 26 as an ON/OFF control voltage when the power supply switch (not shown) is inadvertently closed in the absence of a utensil on induction element 4 is of a relatively high level. Thus, heat is not generated by the inadvertent closing of such a switch. Also, the ON/OFF control voltage which is supplied to control input terminal 26 may be derived from a sensor which senses when the temperature of an object which is heated by induction element 4 is at a predetermined temperature. Thus, power is cut off from the induction element when this predetermined temperature is reached; and when this temperature is reduced, the ON/OFF control voltage is removed so that heat is generated once again. Such an ON/OFF control voltage may be produced by a thermostat device. Of course, the ON/OFF control voltage may be supplied by any detector or feedback device whenever some predetermined condition of load 15 is reached.

The rectifier control circuit shown in FIG. 3 supplies thyristors 12a and 12b with trigger pulses only when the input AC signal is at its zero crossing level. This means that if the apparatus is turned ON at some arbitrary point during the AC cycle, neither of the thyristors is conductive until the beginning of a half cycle. Accordingly, an incomplete rectified half cycle, such as shown in FIG. 4I, is avoided. In this waveform, it is assumed that the apparatus is turned ON and thyristor 12b is rendered conductive during the middle portion of the negative half cycle. By the present invention, neither thyristor 12a nor thyristor 12b is triggered into conduction during the middle portion of a half cycle. Hence, problems associated with the incomplete waveform shown in FIG. 4I, such as undesired noise, possible circuit damage caused by abrupt high-level current increase, and the like, are avoided.

Figure 5A:
FIGS. 5A–5C are waveform diagrams which are helpful in understanding the advantages which are achieved by the present invention.
Figure 5B:
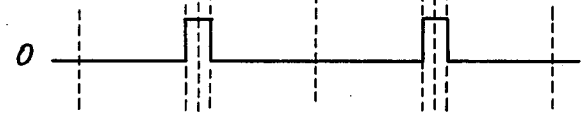

During half wave rectification operation, it is advantageous to generate trigger pulses only during one half cycle, such as the negative half cycle, and not during any portion of the other half cycle. It may be thought that the control over thyristors 12a and 12b can be achieved merely by generating pulses at the zero crossing times of the input AC signal. Thus, full wave rectification is attained by generating such pulses during both the negative and positive zero crossings, while half wave rectification is attained by generating such pulses during only the positive crossings or during only the negative crossings. Let it be assumed that trigger pulses are generated during only the negative crossings of the AC signal. As is known, such pulses exhibit a finite duration which overlaps the ending portion of the positive half cycle and the beginning portion of the negative half cycle. Such a zero crossing pulse is shown in FIG. 5B, and its duration is seen to overlap the vicinity of the zero level of the positive and negative half cycles shown in rectified form in FIG. 5A. Since these pulses are to be used to achieve a half wave rectification, FIG.

5B illustrates that such pulses are generated during only alternate (e.g. negative) zero crossings.

Figure 5C:
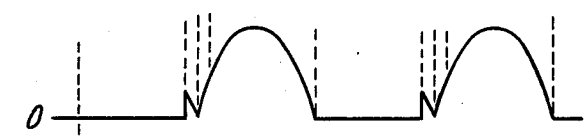

When a trigger pulse obtained from detecting the zero crossings of the AC signal is supplied to both thyristors 12a and 12b, it is seen that thyristor 12a receives this trigger pulse during the ending portion of the positive half cycle. This means that thyristor 12a is triggered into its conductive state so as to conduct this ending portion of the positive half cycle. Then, at the termination of the positive half cycle and the initiation of the negative half cycle, thyristor 12a is rendered non-conductive and thyristor 12b is turned ON. Consequently, substantially all of the negative half cycle is conducted to the load by thyristor 12b. At the completion of this negative half cycle and the initiation of the next following positive half cycle, thyristor 12b is turned OFF. However, at this time, since no trigger pulse had been generated, thyristor 12a is not yet turned ON. But at the ending portion of this positive half cycle, since a trigger pulse is produced, thyristor 12a conducts such ending portion to the load. As a result of this triggering of thyristor 12a during the ending portion of each positive half cycle, the rectified current which is supplied to the load by rectifier 11 appears as shown in FIG. 5C. It is appreciated that the brief duration during the ending portion of each positive half cycle at which thyristor 12a is conductive results in an undesired, spurious noise pulse component which precedes the rectified half wave form. Because of the sharp rising edge of this spurious noise pulse, it is possible that much undesired noise may be generated and, moreover, since this noise component appears as a power impulse, it is possible that a portion of load 15 may be damaged thereby. These problems and dangers are avoided by the present invention in which an undesired spurious noise pulse is not produced when rectifier 11 functions as a half wave rectifier.

While the present invention has been particularly shown and described with reference to a preferred embodiment, it should be readily apparent to those of ordinary skill in the art that various changes and modifications in form and details may be made without departing from the spirit and scope of the invention. Furthermore, although a preferred application of this invention has been described, it should be readily apparent that the rectifier control circuit described herein can be used to control the operation of a rectifier which supplies current to any desired load. Therefore, it is intended that the appended claims be interpreted as including such changes and modifications.

What is claimed is:

1. A controllable rectifier circuit for selectively producing a half-wave or a full-wave rectified signal, comprising:

a pair of input terminals adapted to be supplied with an AC signal;

a bridge rectifier coupled to said pair of input terminals and including a pair of output terminals across which a rectified AC signal is produced, said bridge rectifier comprising a first current path including a switchable rectifier for conducting positive half cycles of said AC signal and a second current path including a switchable rectifier for conducting negative half cycles of said AC signal;

means coupled to said pair of input terminals for receiving, in sequence, reduced amplitude versions of said positive and negative half cycles of said AC signal to produce an output pulse when the reduced amplitude of a respective one of said positive and negative half cycles is less than a predetermined level;

means for selectively supplying one of said half cycles of said AC signal to said last-mentioned pulse producing means to prevent said pulse producing means from producing an output pulse during said one half cycle, and thereby produce an output pulse during the beginning and ending portions of each of said other half cycle; and means for supplying the output pulses produced by said pulse producing means to each of said switchable rectifiers, whereby said bridge rectifier rectifies both half cycles of said AC signal when said one half cycle is not supplied to said pulse producing means, and said bridge rectifier rectifies only said other half cycle of said AC signal when said one half cycle is supplied to said pulse producing means.

2. The circuit of claim 1 wherein said pulse producing means comprises a transistor means having conductive and nonconductive states, said transistor means being placed in one state when said reduced amplitude versions of said positive and negative half cycles of said AC signal exceed said predetermined level and being placed in the other state when said reduced amplitude versions of said positive and negative half cycles of said AC signal are less than said predetermined level, whereby said output pulses are produced when said transistor means is in only one of said states.

3. The circuit of claim 2 further comprising first means for supplying said reduced amplitude version of said positive half cycle of said AC signal to said transistor means, and second means for supplying said reduced amplitude version of said negative half cycle of said AC signal to said transistor means; and wherein said means for selectively supplying one of said half cycles of said AC signal to said pulse producing means comprises switch means selectively operable to supply one of said half cycles to said transistor means, the amplitude of said half cycle supplied thereby being greater than the reduced amplitude version thereof so as to place said transistor means in a predetermined state throughout substantially all of said one half cycle, whereby an output pulse is not produced.

4. The circuit of claim 3 wherein each of said first and second means comprises a voltage divider, so that said reduced amplitude versions of said positive and negative half cycles are voltage divided replicas of said half cycles.

5. The circuit of claim 3 further comprising limiting means for limiting the maximum amplitudes of the respective signals supplied to said transistor means.

6. The circuit of claim 5 wherein said limiting means comprises a first diode coupled to said first and second means for supplying said reduced amplitude versions of said half cycles to the base electrode of said transistor means, and a second diode coupled to said switch means for supplying said one of said half cycles to said base electrode of said transistor means, whereby the maximum amplitudes of the respective signals supplied to said transistor means are limited to the voltage drop across the respective diode plus the voltage drop across the base-emitter circuit of said transistor means.

7. The circuit of claim 5 wherein said switch means comprises conducting means connected between one of said input terminals and said transistor means; and a transistor connected in shunt relation with said conducting means and operative to inhibit said one of said half cycles from being supplied to said transistor means.

8. The circuit of claim 3 further comprising inhibit means coupled to said transistor means for supplying an inhibit signal thereto for maintaining said transistor means in its predetermined state throughout the positive and negative half cycles of said AC signal.

9. The circuit of claim 1 wherein each of said switchable rectifiers comprises thyristor means responsive to an output pulse supplied thereto for switching to a conducting state.

10. A power supply circuit for supplying a controllable amount of power to a load, comprising:

a pair of input terminals adapted to be supplied with an AC signal;

a bridge rectifier coupled to said pair of input terminals and including a pair of output terminals across which a rectified AC signal is produced and to which said load is connected, said bridge rectifier having a first current path including a thyristor for conducting each of one half cycle of said AC signal and a second current path including a thyristor for conducting each of the other half cycle of said AC signal;

a first attenuator connected between one of said input terminals and one of said output terminals for producing an attenuated version of each of said one half cycle;

a second attenuator connected between the other of said input terminals and said one output terminal for producing an attenuated version of each of said other half cycles;

pulse producing means coupled to said first and second attenuators for generating an output pulse whenever the amplitude of the attenuated half cycles supplied thereto is less than a predetermined level;

means coupled to a predetermined input terminal for supplying a respective half cycle to said pulse producing means to inhibit said pulse producing means from producing an output pulse over substantially the entire duration of said respective half cycle;

switch means responsive to a control signal representing that the amount of power supplied to said load should be increased for preventing said respective half cycle from being supplied to said pulse producing means; and means for supplying the output pulses to said thyristors for conditioning each thyristor to conduct its respective half cycle of said AC signal.

* * * * *